(12) United States Patent
Jo (10) Patent No.: US 7,286,122 B2
(45) Date of Patent: Oct. 23, 2007

(54) ELECTRONIC DEVICE, ELEMENT SUBSTRATE, ELECTRO-OPTICAL DEVICE, METHOD OF PRODUCING THE ELECTRO-OPTICAL DEVICE, AND ELECTRONIC APPARATUS

(75) Inventor: Hiroaki Jo, Fujimi-cho (JP)

(73) Assignee: Seiko Epson Corporation, Tokyo (JP)

( * ) Notice: Subject to any disclaimer, the term of this patent is extended or adjusted under 35 U.S.C. 154(b) by 556 days.

(21) Appl. No.: 10/773,139

(22) Filed: Feb. 9, 2004

(65) Prior Publication Data

US 2004/0233140 A1 Nov. 25, 2004

(30) Foreign Application Priority Data

Mar. 31, 2003 (JP) ............................. 2003-097504

(51) Int. Cl.
*G09G 3/30* (2006.01)
(52) U.S. Cl. .................... 345/204; 345/55; 345/87; 345/90; 345/690; 313/504; 315/169.3
(58) Field of Classification Search ................. 345/55, 345/76, 87, 90, 93, 204, 690, 78; 313/504; 315/169.3
See application file for complete search history.

(56) References Cited

U.S. PATENT DOCUMENTS 5,490,002 A * 2/1996 Nicholas .................... 349/50

| 6,356,248 | B1 * | 3/2002 | Martin et al. ............. 345/60 |
| 6,522,315 | B2 | 2/2003 | Ozawa et al. |
| 6,774,575 | B2 | 8/2004 | Sekiya |
| 2001/0011989 | A1 * | 8/2001 | Hayashi ...................... 345/100 |
| 2002/0058399 | A1 * | 5/2002 | Sato et al. .................. 438/486 |
| 2003/0030601 | A1 * | 2/2003 | Komiya ...................... 345/76 |
| 2003/0111966 | A1 * | 6/2003 | Mikami et al. ........... 315/169.3 |
| 2003/0169247 | A1 * | 9/2003 | Kawabe et al. ............ 345/204 |
| 2003/0169379 | A1 * | 9/2003 | Tsumura et al. ............ 349/42 |
| 2003/0193286 | A1 * | 10/2003 | Ottermann et al. ......... 313/506 |

FOREIGN PATENT DOCUMENTS

| JP | A 2000-195677 | 7/2000 |
| JP | A 2001-257080 | 9/2001 |
| JP | A-2003-055335 | 2/2003 |
| TW | 477154 | 2/2002 |
| WO | WO98/36407 | 8/1998 |

* cited by examiner

*Primary Examiner*—Bipin Shalwala
*Assistant Examiner*—Vincent E. Kovalick
(74) *Attorney, Agent, or Firm*—Oliff & Berridge, PLC (57) ABSTRACT

To provide an electronic circuit, an element substrate, an electronic device, an electro-optical device, and an electronic apparatus, which make it possible to perform a precise controlling operation even if manufacturing variations occur, a circuit formation area is an annular formation area of a pixel of a display panel, and does not include a substantially central portion of the pixel. A light emission area is provided in the substantially central portion. One drive circuit is formed in the circuit formation area, and four organic elements OLED are formed in the light emission area. The drive circuit and the organic elements OLED are connected parallel to each other with wirings.

11 Claims, 9 Drawing Sheets

ELECTRONIC DEVICE, ELEMENT SUBSTRATE, ELECTRO-OPTICAL DEVICE, METHOD OF PRODUCING THE ELECTRO-OPTICAL DEVICE, AND ELECTRONIC APPARATUS

BACKGROUND OF THE INVENTION

1. Field of Invention

The present invention relates to an electronic device, an element substrate, an electro-optical device, a method of producing the electro-optical device, and an electronic apparatus.

2. Description of Related Art

One example of a related art electro-optical device is an electro-optical device including current drive electronic elements, such as organic electroluminescence (EL) elements. In the electro-optical device, pixels including the organic EL elements are disposed in a matrix on its display panel. The pixels are connected to a data-line drive circuit through data lines. Data signals output from the data-line drive circuit are supplied to the respective pixels at a predetermined timing, and the organic EL elements emit light in accordance with current levels of the data signals. See International Publication No. WO98/36407 Pamphlet.

SUMMARY OF THE INVENTION

However, in the related art electro-optical device, due to manufacturing variations occurring in, for example, the organic EL elements that make up the respective pixels, display quality of the electro-optical device may be reduced. For example, when an organic EL element is not properly formed, a pixel formation area where this organic EL element is formed may provide a dark display all the time. Therefore, the display quality of the electro-optical device is reduced.

Accordingly, the present invention provides an electronic device, an element substrate, an electro-optical device, a method of producing the electro-optical device, and an electronic apparatus, which make it possible to perform a precise controlling operation even if manufacturing variations occur.

An electronic device according to an aspect of the present invention includes a plurality of unit circuits in correspondence with intersections of a plurality of first signal lines and a plurality of second signal lines. Each unit circuit includes at least two electronic elements or at least two active elements. Each electronic element has a first terminal and a second terminal and is driven by a drive voltage applied to the first terminal or by a drive current flowing between the first terminal and the second terminal. Each active element controls the drive voltage or the drive current.

According to this structure, it is possible to provide an electronic device including unit circuits which are properly driven even if an electronic element or an active element of any unit circuit is not driven due to a defect in the element.

The electronic device may further include a plurality of power lines. The active element may be electrically connected between the electronic element and corresponding one of the power lines.

According to this structure, it is possible to provide an electronic device which includes electronic elements or active elements to which drive current is supplied through the power lines and which are driven even if an electronic element or an active element is not driven due to a defect in the element.

An electro-optical device according to an aspect of the present invention includes a plurality of pixel circuits in correspondence with intersections of a plurality of scanning lines and a plurality of data lines. Each pixel circuit includes at least two electro-optical elements or at least two active elements. Each electro-optical element has a first terminal and a second terminal and is driven by a drive voltage applied to the first terminal or by a drive current flowing between the first terminal and the second terminal. Each active element controls the drive voltage or the drive current.

According to this structure, even if an electro-optical element of any unit pixel is not driven due to a defect occurring in the electro-optical element, another electro-optical element can be properly driven by disconnecting the defective electro-optical element from the corresponding active element. In addition, even if an active element of any unit pixel is not driven due to a defect occurring in the active element, by disconnecting the active element from the electro-optical element, the electro-optical elements can be controlled by another active element that is properly driven.

Therefore, a dark display of a pixel formation area resulting from a defect occurring in an electro-optical element or an active element will never occur.

An electro-optical device according to an aspect of the present invention includes a plurality of unit pixels in correspondence with intersections of a plurality of scanning lines and a plurality of data lines. Each unit pixel includes a plurality of electro-optical elements and a plurality of control electronic elements to control a drive voltage or a drive current supplied to the electro-optical elements. The plurality of unit pixels each include a control electronic element which is electrically disconnected from the electro-optical element.

According to this structure, even if a control electronic element of each unit pixel is not driven due to a defect occurring in the control electronic element, by disconnecting the control electronic element from the electro-optical elements, the electro-optical elements can be controlled by another control electronic element which is properly driven. Therefore, a dark display of a corresponding pixel formation area resulting from a defect occurring in the control electronic element will never occur. Therefore, it is possible to restrict a reduction in the display quality of the electro-optical device caused by a defect occurring in the control electronic element.

In the electro-optical device, each electro-optical element is an EL element.

According to this structure, it is possible to restrict a reduction in the display quality of the electro-optical device whose electro-optical elements are EL elements.

In the electro-optical device, each EL element may be an organic EL element.

According to this structure, it is possible to restrict a reduction in the display quality of the electro-optical device whose electro-optical elements are organic EL elements.

An electro-optical device according to an aspect of the present invention includes a plurality of unit pixels in correspondence with intersections of a plurality of scanning lines and a plurality of data lines. Each unit pixel has a plurality of electro-optical material placement areas where electro-optical material is placed. The plurality of unit pixels include a unit pixel having an electro-optical material placement area in which the electro-optical material does not operate, among the plurality of electro-optical material placement areas.

According to this structure, the electro-optical device of an aspect of the present invention has an electro-optical material placement area that does not operate, among the electro-optical material placement areas. Accordingly, since the electro-optical material placement area that does not operate is virtually unused, it is possible to restrict a reduction in the display quality of the electro-optical device.

In the electro-optical device, the electro-optical material may be an organic material.

According to this structure, the electro-optical device of an aspect of the present invention is such that the electro-optical material is an organic material, and has an electro-optical material placement area that does not operate, among the electro-optical material placement areas. Accordingly, since the electro-optical material placement area that does not operate is virtually unused, it is possible to restrict a reduction in the display quality of the electro-optical device.

An element substrate according to an aspect of the present invention includes an element formation area and a circuit formation area, which are disposed on a transparent substrate. The element formation area is used to dispose a plurality of electronic elements of one electronic circuit whose optical characteristics or electrical characteristics change depending upon either a voltage level supplied between a first terminal and a second terminal of each electronic element or a current level supplied between the first terminal and the second terminal of each electronic element. The circuit formation area is used to dispose a drive circuit including a transistor of the electronic circuit to supply the voltage level or the current level in correspondence with an electrical signal to the first terminal of each electronic element. The element formation area is disposed at a central portion, and the element formation area is disposed around the element formation area.

According to this structure, it is possible to output signals from the electronic elements disposed on the transparent substrate to the central portion of the circuit formation area in a concentrated manner. Therefore, for example, when the electro-optical elements are formed on the element substrate, light corresponding to the signals output from the respective electro-optical elements is emitted to the central portion at the circuit formation area in a concentrated manner. Consequently, even if there is any electro-optical element that does not emit light due to a manufacturing defect in the electro-optical element, it is possible to reduce variations in the light emission.

In the element substrate, the element formation area may include the electronic elements.

According to this structure, it is possible to output signals from the electronic elements disposed on the transparent substrate to the central portion of the circuit formation area in a concentrated manner. Therefore, for example, when the electro-optical elements are formed on the element substrate, light corresponding to the signals output from the respective electro-optical elements is emitted to the central portion of the circuit formation area in a concentrated manner. Consequently, even if there is any electro-optical element that does not emit light due to a manufacturing defect in the electro-optical element, it is possible to reduce variations in the light emission.

According to an aspect of the present invention, there is provided a method of producing an electro-optical device including a plurality of unit pixels in correspondence with intersections of a plurality of scanning lines and a plurality of data lines, the plurality of unit pixels each including electro-optical material placement areas where electro-optical material is placed and a plurality of active elements to control operations of the electro-optical material placement areas. The method includes electrically disconnecting an electro-optical material placement area that does not operate among the electro-optical material placement areas from the corresponding active element.

According to this method, any of the electro-optical material placement areas that do not operate are electrically disconnected from the corresponding active element. Therefore, it is possible to produce an electro-optical device in which any electro-optical material placement area that does not operate is virtually unused. As a result, it is possible to provide an electro-optical device whose reduction in display quality is restricted.

In the method of producing an electro-optical device, electrically disconnecting an electro-optical material placement area that does not operate from the corresponding active element may be carried out by laser.

According to this structure, since any electro-optical material placement area that does not operate is electrically disconnected from the corresponding active element by laser, it is possible to precisely and easily produce an electro-optical device in which any electro-optical material placement area that does not operate is virtually unused.

An electronic apparatus of the an aspect of present invention includes either of the above-described electronic devices.

According to this structure, it is possible to provide an electronic apparatus that is properly driven even if an electronic element or an active element which constitutes any unit circuit is not driven due to a defect in the element.

An electronic apparatus of an aspect of the present invention includes any one of the above-described electro-optical devices.

According to this structure, it is possible to provide an electronic apparatus that is properly driven even if an electro-optical element or an active element constituting any pixel circuit is not driven due to a defect in the element.

An electronic apparatus of an aspect of the present invention includes the above-described element substrate.

According to this structure, even if any electro-optical element does not emit light due to a manufacturing defect in the electro-optical element, it is possible to provide an electronic apparatus in which variations in the light emission are reduced.

An electronic apparatus of an aspect of the present invention is produced by either one of the above-described methods of producing an electro-optical device.

According to this structure, by virtually not using any of the electro-optical material placement areas that does not operate, it is possible to restrict a reduction in the display quality of the electronic apparatus.

DETAILED DESCRIPTION OF EXEMPLARY EMBODIMENTS

First Exemplary Embodiment

Figure 1:
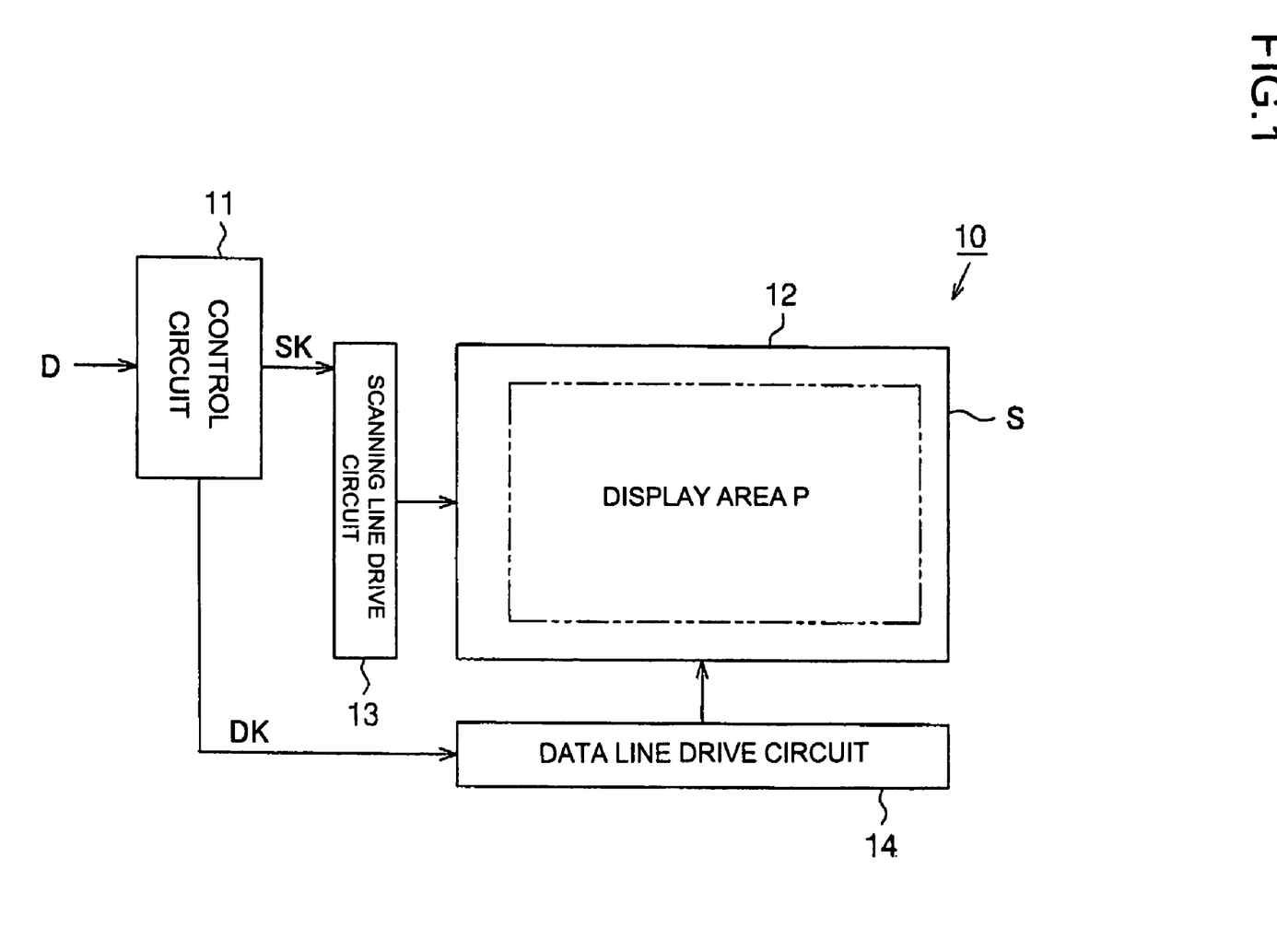
FIG. 1 is a block schematic for illustrating the electrical structure of an organic EL display.
Figure 2:
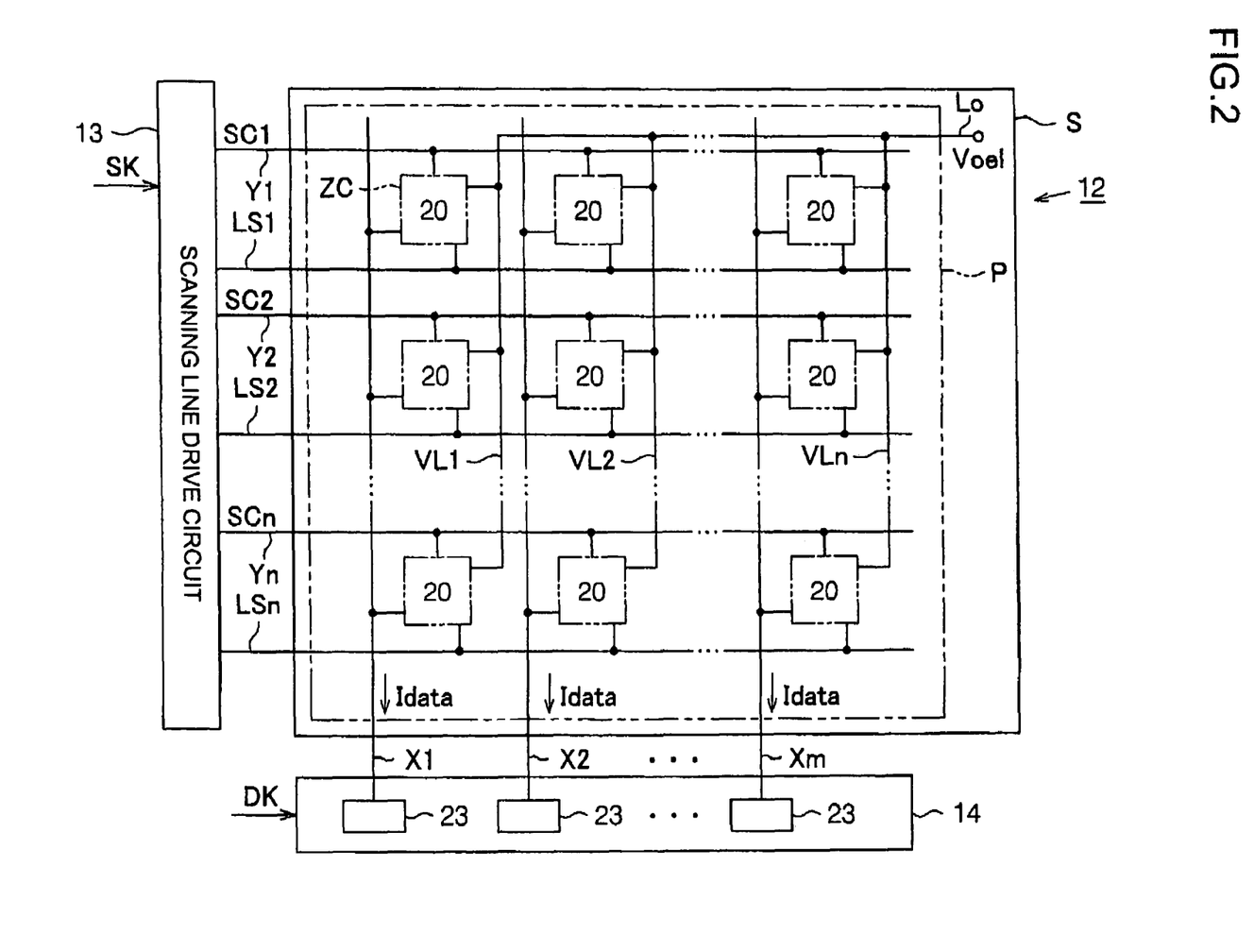
FIG. 2 is a block circuit schematic of the electrical structure of a display panel and a data line drive circuit.

A first exemplary embodiment of the present invention will be described with reference to FIGS. 1 to 5. FIG. 1 is a block schematic of the electrical structure of an organic EL display. FIG. 2 is a block circuit schematic of the electrical structure of a display panel.

An organic EL display 10 includes a control circuit 11, a display panel 12, a scanning line drive circuit 13, and a data line drive circuit 14. The control circuit 11, the scanning line drive circuit 13, and the data line drive circuit 14 of the organic EL display 10 may be formed by individual electronic parts. For example, the control circuit 11, the scanning line drive circuit 13, and the data line drive circuit 14 may each be formed by one semiconductor integrated circuit device chip. Alternatively, all or part of the control circuit 11, the scanning line drive circuit 13, and the data line drive circuit 14, may be formed by a programmable IC chip, and the operations may be carried out using software by a program that is written on the corresponding IC chip.

The organic EL display 10 in the exemplary embodiment is what is called a back-emission display which displays a predetermined image on the back surface side of a transparent substrate S.

Based on image data D supplied from an external device (not shown), the control circuit 11 produces a scanning driving signal SK and a data-line driving signal DK to display an image on the display panel 12. The control circuit 11 outputs the scanning driving signal SK to the scanning line drive circuit 13, and the data-line driving signal DK to the data-line drive circuit 14.

The display panel 12 includes a display area P at the central portion of the transparent substrate S. As shown in FIG. 2, a plurality of pixels 20 are disposed in a matrix in the display area P. m data lines X1 to Xm (m is a natural number) extend in the display area P in the direction of columns of the pixels 20 disposed in a matrix. n scanning lines Y1 to Yn (n is a natural number) also extend in the display area P in the direction of rows of the pixels 20 disposed in a matrix. The pixels 20 are disposed at locations corresponding to intersections of the data lines X1 to Xm and the scanning lines Y1, to Yn. The pixels 20 are connected to the respective data lines X1 to Xm and the respective scanning lines Y1 to Yn.

A drive voltage supply line Lo is disposed in the display area P. A drive voltage Voel is supplied to the drive voltage supply line Lo. m power lines VL1 to VLm (m is a natural number) are connected to the drive voltage supply line Lo. In the exemplary embodiment, the power lines VL1 to VLm are disposed parallel to the data lines X1 to Xm. The power lines VL1 to VLm are connected to their respective pixels 20. Therefore, the drive voltage Voel is supplied to the pixels 20 through the drive voltage supply line Lo and the respective power lines VL1 to VLm.

n signal lines LS1 to LSn (n is a natural number) are also disposed in the display area P. The signal lines LS1 to LSn are disposed parallel to the direction of rows of the pixels 20. The signal lines LS1 to LSn are connected to the respective pixels 20, and to the scanning line drive circuit 13. The signal lines LS1 to LSn supply to the respective pixels 20 timing signals SY1 to SYn (n is a natural number), which are described later, output from the scanning line drive circuit 13.

The scanning line drive circuit 13 selects one of the n scanning lines Y1 to Yn extending in the display area P based on the scanning driving signal SK output from the control circuit 11, and outputs a corresponding signal among scanning signals SC1 to SCn (n is a natural number) to the selected scanning line. The scanning line drive circuit 13 generates, based on the scanning driving signal SK, the timing signals SY1 to SYn to control the period of light emission of organic EL elements OLED in the respective pixels 20, and outputs the generated timing signals SY1 to SYn to the respective pixels 20 through the respective signal-lines LS1 to LSn.

As shown in FIG. 2, the data line drive circuit 14 includes a plurality of single line drivers 23. The single line drivers 23 are electrically connected to the respective pixels 20 through the data lines X1 to Xm. Based on the data line driving signal DK output from the control circuit 11, the single line drivers 23 generate data signals Idata. The single line drivers 23 output the generated data signals Idata to the respective pixels 20 through the data lines X1 to Xm. In the exemplary embodiment, the data signals Idata are current signals. Therefore, the single line drivers 23 generate current values based on the data line drive signal DK, and output current of the generated values as the data signals Idata to the respective pixels 20 through the data lines X1 to Xm.

Figure 3:
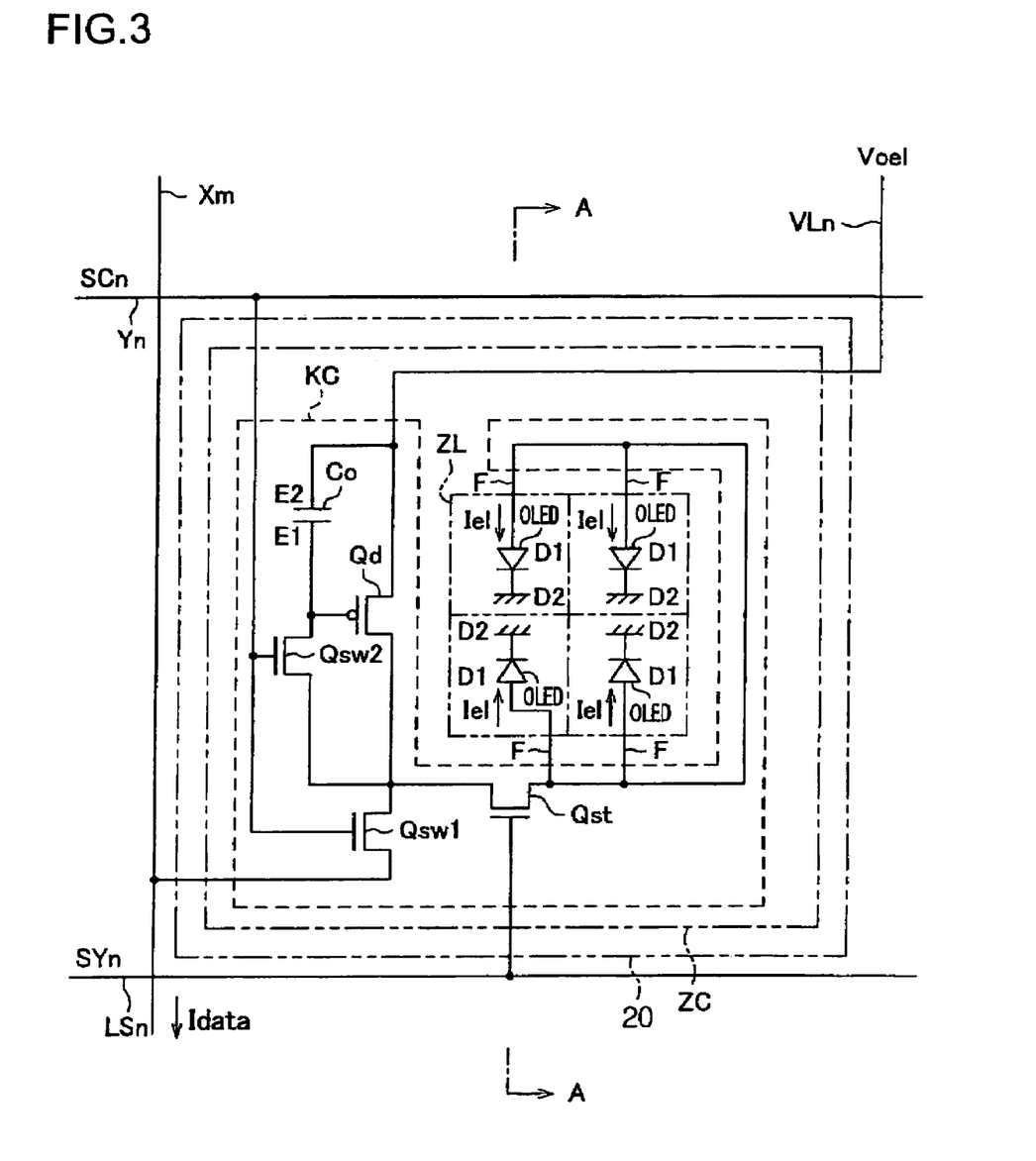
FIG. 3 is a circuit schematic of a pixel in the first exemplary embodiment.

Next, an electrical structure of the pixels 20 will be described with reference to FIG. 3. FIG. 3 shows the electrical structure of each pixel 20.

Each pixel 20 has a circuit formation area ZC and a light-emission area ZL in a corresponding pixel 20 formation area. The circuit formation area ZC is an area where a drive circuit KC is formed. The light-emission area ZL is an area where a plurality of organic EL elements OLED are formed, with the organic EL elements having light-emitting films LF (see FIG. 4) that form a light-emission layer of each light-emission area ZL and that are formed of an organic material. In the exemplary embodiment, the circuit formation area ZC is an annular formation area that does not include a substantially central portion, and the light-emission area ZL is a formation area corresponding to the substantially central portion.

Since the pixels 20 all have the same structure, only the pixel 20 that is disposed at a location in correspondence with the intersection of an nth scanning line Yn and an mth data line Xm will be described for convenience of explanation.

The drive circuit KC includes a drive transistor Qd, first and second switching transistors Qsw1 and Qsw2, a start transistor Qst, and a hold capacitor Co. The drive transistor Qd is a transistor that functions as a current source to supply electric current. The first and second switching transistors Qsw1 and Qsw2 and the start transistor Qst are transistors that function as switching elements.

In the exemplary embodiment, the drive transistor Qd has p-type. conductivity, and the first and second switching transistors Qsw1 and Qsw2 and the start transistor Qst each have n-type conductivity. Ordinarily, the drive transistor Qd, the first and second switching transistors Qsw1 and Qsw2, and the start transistor Qst are each a TFT (thin film transistor).

The drain of the drive transistor Qd is connected to the drain of the first switching transistor Qsw1. The source of the first switching transistor Qsw1 is connected to the data line Xm.

The second switching transistor Qsw2 is connected between the drain and the gate of the drive transistor Qd. The gate of the second switching transistor Qsw2 is connected to the gate of the first switching transistor Qsw1 and to the scanning line Yn. Therefore, an on-off control operation is performed on the first switching transistor Qsw1 and the second switching transistor Qsw2 at the same time in accordance with the scanning signal SCn output from the scanning line drive circuit 13 through the scanning line Yn.

The source of the drive transistor Qd is connected to the power line VLm, so that the drive voltage Voel is supplied thereto. A first connection terminal E1 of the hold capacitor Co is connected to the gate of the drive transistor Qd, and the source of the drive transistor Qd is connected to a second connection terminal E2 of the hold capacitor Co. The hold capacitor Co accumulates charge in accordance with the current level of the data signal Idata.

The drain of the drive transistor Qd is connected to the drain of the start transistor Qst. Through a wiring F, the source of the start transistor Qst is connected to an anode D1 of each of the organic EL elements OLED formed in the light-emission area ZL. The gate of the start transistor Qst is connected to the signal line LSn. Therefore, an on-off control operation is performed on the start transistor Qst in accordance with the timing signal SYn supplied from the scanning line drive circuit 13 through the signal line LSn.

A scanning signal SCn of level H is output to the drive circuit KC having the above-described structure from the scanning line drive circuit 13 through the scanning line Yn. This causes the first and second switching transistors Qsw1 and Qsw2 to turn on at the same time. At this time, the data signal Idata is supplied to the drive circuit KC through the data line Xm. A charge that corresponds to the data signal Idata is accumulated in the hold capacitor Co. When a charge that corresponds to the data signal Idata is accumulated in the hold capacitor Co, a scanning signal SCn of level L is output from the scanning line drive circuit 13 through the scanning line Yn. As a result, the first and second switching transistors Qsw1 and Qsw2 are turned off, and a drive current Iel corresponding to the charge accumulated in the hold capacitor Co flows between the source and the drain of the drive transistor Qd. In this state, when a timing signal SYn of level H is supplied from the scanning line drive circuit 13 through the signal line LSn, the start transistor Qst is turned on, and the drive current Iel is supplied to the anode D1 of each of the organic EL elements OLED through its corresponding wiring F. That is, based on the scanning signal SCn and the timing signal SYn output from the scanning line drive circuit 13, the drive circuit KC can supply the drive current Iel corresponding to the data signal Idata to each of the organic EL elements OLED.

In the exemplary embodiment, the light-emission area ZL is divided into two parts each in the horizontal and vertical directions, that is, into a total of four parts by banks 36 and 37 (see FIG. 4) that are described later. One organic EL element OLED is formed in each divided area part. In other words, four organic EL elements OLED are formed adjacent each other in the vertical and horizontal directions at substantially the central portion of each pixel 20.

The anode D1 of each organic EL element OLED having the above-described structure is connected to the drain of the aforementioned one drive transistor Qd through the corresponding wiring F and the start transistor Qst. A cathode D2 of each-organic EL element OLED is connected to ground. In other words, four organic EL elements OLED are connected parallel to each other between the source of the start transistor Qst and ground.

Therefore, by turning on the start transistor Qst, the drive current Iel flowing between the source and drain of the drive transistor Qd is supplied to each of the four organic EL elements OLED.

When the drive current Iel is supplied, if, as is the related art, there is only one organic EL element OLED for one pixel, the input impedances of the organic EL elements OLED of the pixels vary. Therefore, a variation occurs in a voltage Vds between the drain and source of the drive transistor Qd. As a result, a variation occurs in the drive current Iel. However, when, as in an aspect of the present invention, there are four organic EL elements OLED in one pixel, even if variation occurs between the input impedances of the organic EL elements OLED, a drive current of an amount corresponding to that flowing in the organic EL element OLED having a high input impedance flows in the organic EL elements OLED having a low input impedance. Therefore, the amount of drive current Iel of the four organic EL elements OLED as a whole is averaged. In other words, by connecting the four organic EL elements OLED parallel to each other with respect to one drive transistor Qd, it is possible to accommodate variations in the input impedances of the organic EL elements.

Further, by connecting the four organic EL elements OLED parallel to each other with respect to one drive transistor Qd, even if, for example, three of the four organic EL elements OLED do not emit light at all due to manufacturing defects in the three organic EL elements OLED, the remaining one organic EL element OLED can emit light. Here, even if the number of organic EL elements OLED emitting light is reduced from four to one, since the amount of drive current Iel of the four organic EL elements OLED as a whole is not changed, it is possible to emit light having the same luminance as when all four of the organic EL elements OLED emit light. As a result, compared to a display having a related art pixel in which one organic EL element OLED is formed with respect to one drive transistor Qd, it is possible to reduce variations in light emission of the organic EL elements OLED.

Next, a method of producing each pixel 20 having the above-described structure will be described with reference to FIG. 4.

Figure 4:
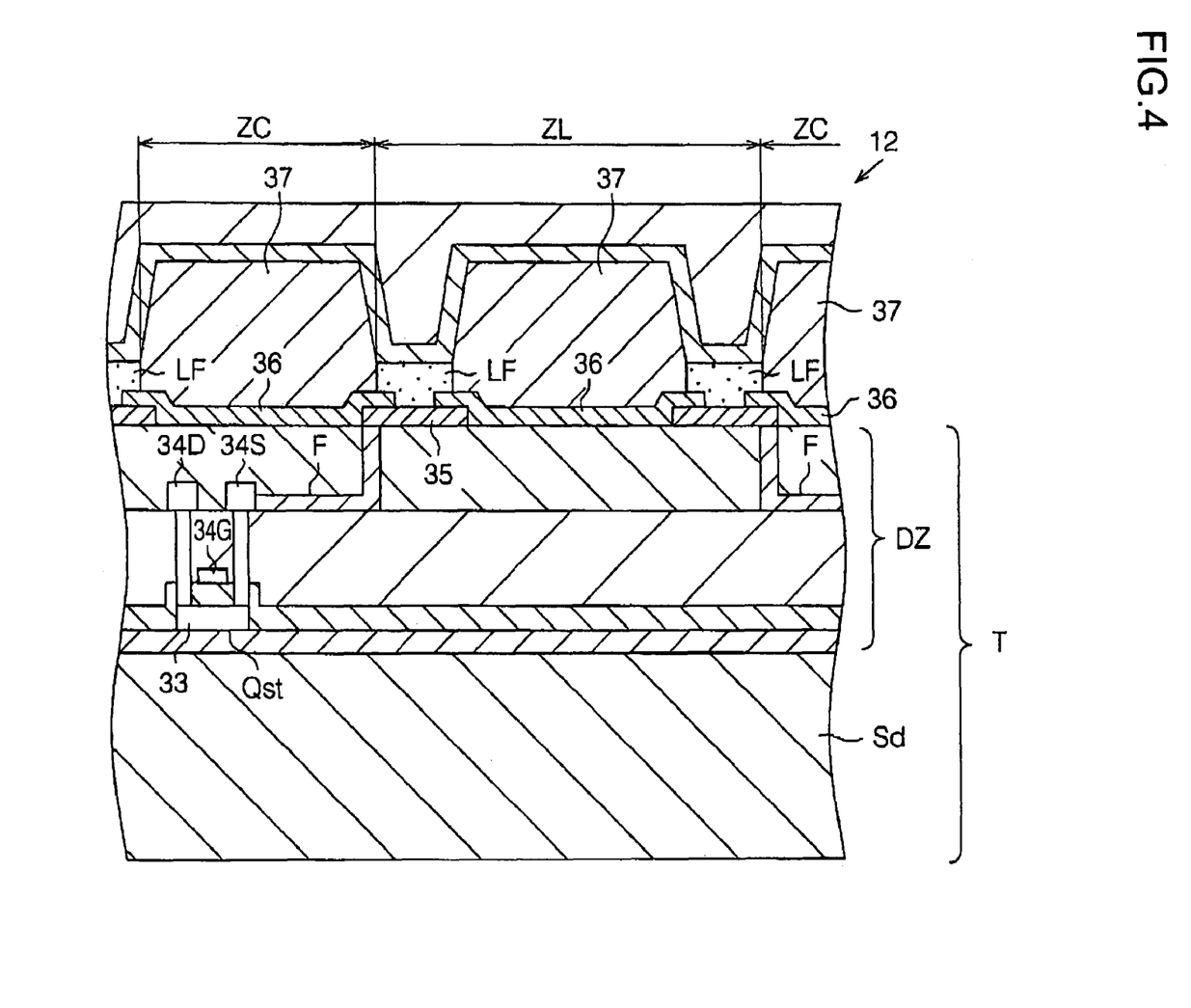
FIG. 4 is a partial sectional view of the display panel in the first exemplary embodiment.

FIG. 4 is a partial sectional view of the structure of the display panel 12 including a pixel 20. The partial cross sectional view of FIG. 4 is a cross sectional view taken along plane A-A of FIG. 3 in which the start transistor Qst and two organic EL elements OLED that are connected to the start transistor Qst through the wirings F are formed. The other pixels 20 have the same structure in cross section, so that they will not be described in detail below.

As shown in FIG. 4, the display panel 12 includes a transparent substrate Sd, an element formation layer DZ disposed on the transparent substrate Sd, and the light-emitting films LF forming the organic EL elements OLED and being disposed in the element formation layer DZ of an electro-optical material placement area or an element formation area. An element substrate T is formed by the transparent substrate Sd and the element formation layer DZ.

As shown in FIG. 4, the drive circuit KC corresponding to each of the light-emitting films LF is formed in the element formation layer DZ of the circuit formation area ZC. The drive circuit KC is not formed in the element formation layer DZ of the light emission area ZL.

The start transistor Qst constituting the drive circuit KC is formed at the element formation layer DZ.

Specifically, a silicon layer 33 of the start transistor Qst is formed on the transparent substrate Sd and an insulating film 32 formed of silicon dioxide. A gate 34G, a source 34S, and a drain 34D of the start transistor Qst are formed on an oxide film disposed on the insulating film 32 formed of silicon dioxide.

The source 34S is electrically connected to a pixel electrode 35 formed on the element formation layer DZ through the wiring F. The pixel electrode 35 is formed of a conductive transparent material, which is indium tin oxide (ITO) in the exemplary embodiment. First banks 36 formed of an inorganic material to electrically insulate the pixel electrode 35 from other pixel electrodes 35 are formed on the element formation layer DZ. Second banks 37 formed of an organic material are formed on the first banks 36. The first banks 36 and second banks 37 are banks to separate adjacent light-emitting films LF. A portion of the pixel electrode 35 is open. The light-emitting films LF formed of an organic material are disposed on the pixel electrode 35 so as to include the open portion of the pixel electrode 35. In the exemplary embodiment, the light-emitting films LF are formed by discharging an organic material onto respective predetermined locations surrounded by the first and second banks 36 and 37 by an inkjet method.

After producing the display panel 12 having the above-described structure, any wiring F connected to the pixel electrode 35 of a light-emitting film LF that does not operate optically among the four light-emitting film LF is disconnected by, for example, laser. By this, the drive current Iel is not supplied to the disconnected light-emitting film LF. As a result, since other light-emitting films LF that operate optically can be made to operate, it is possible not to substantially use any light-emitting layer LF that produces a black display all the time. Therefore, it is possible to restrict a reduction in the display quality of the organic EL display 10.

Consequently, even if manufacturing variations occur in the organic EL elements OLED, it is possible to produce the organic EL display 10 which makes it possible to perform a precise controlling operation.

The drive transistor Qd in the exemplary embodiment corresponds to either the active element or the control electronic element disclosed in the claims. Each organic EL element OLED in the exemplary embodiment corresponds to the electronic element or the electro-optical element disclosed in the claims. The anode D1 and the cathode D2 of each organic EL element OLED in the exemplary embodiment correspond to the first terminal and the second terminal disclosed in the claims.

The data signals Idata, the data lines X1 to Xm, and the pixels 20 correspond to the electrical signals, signal lines and electronic circuits, and unit circuits or unit pixels, respectively, disclosed in the claims.

Next, a method of driving the organic EL display 10 having the above-described structure will be described with reference to FIG. 5.

Figure 5:
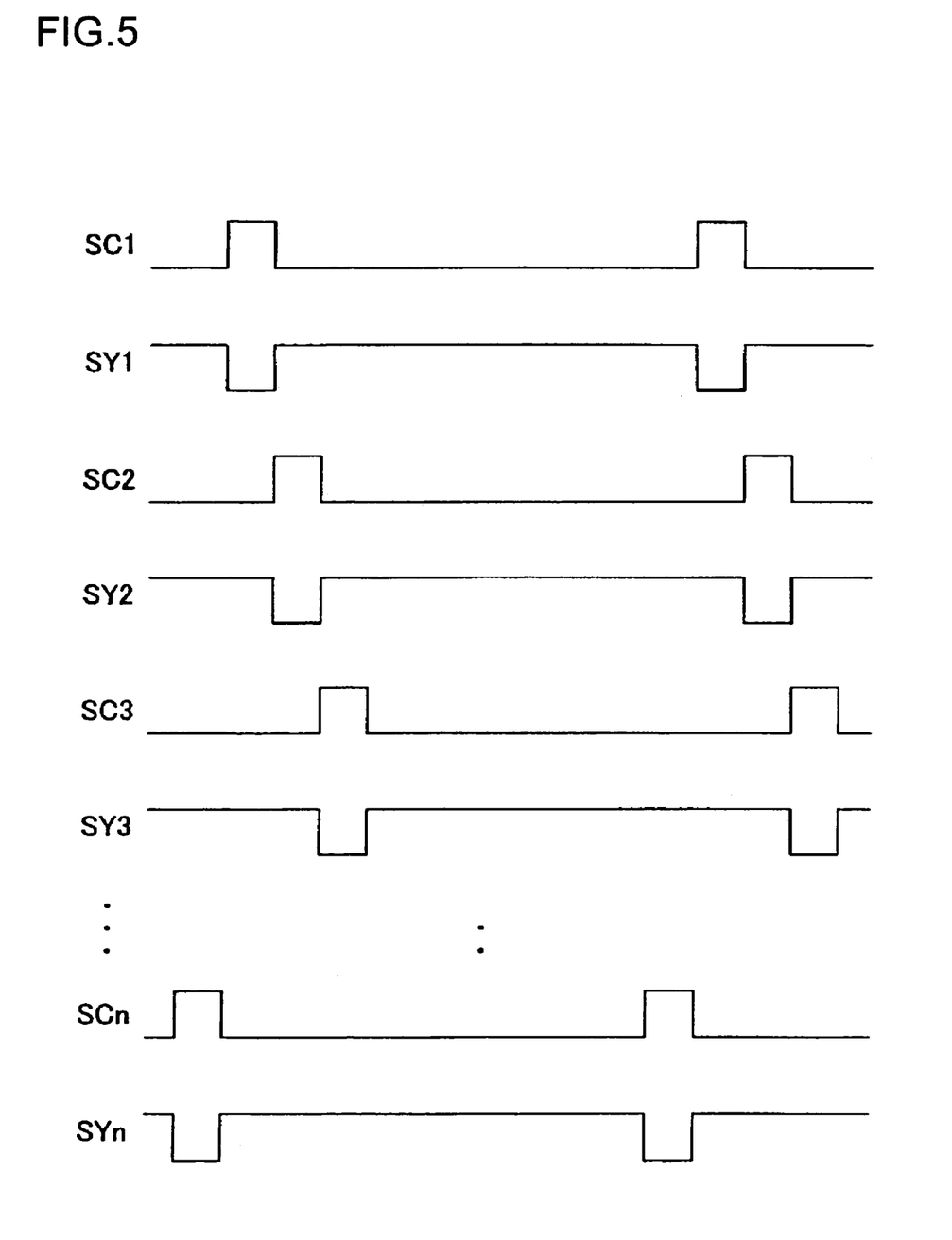
FIG. 5 is a timing chart for illustrating a method of driving the organic EL display.

FIG. 5 shows a timing chart to describe the method of driving the organic EL display 10.

Based on the scanning drive signal SK output from the control circuit 11, the scanning line drive circuit 13 selects the scanning line Y1. Then, the scanning line drive circuit 13 outputs a scanning signal SC1 of level H. This causes the first and second switching transistors Qsw1 and Qsw2 of each pixel 20 to be turned on at the same time, and the data signals Idata to be supplied to a plurality of the hold capacitors Co through the data lines X1 to Xm. By this, a charge that is in correspondence with each of the data signals Idata is accumulated in each of the hold capacitors Co. In other words, data is written to each of the pixels 20 on the selected scanning line Y1.

At this time, the scanning line drive circuit 13 outputs a timing signal SY1 of level L. This causes the start transistors Qst of the respective pixels 20 on the scanning line Y1 to be turned off. Therefore, the drive current Iel is not supplied to the organic EL elements OLED, so that they still do not emit light.

Thereafter, the scanning line drive circuit 13 supplies a scanning signal SC1 of level L and outputs a timing signal SY1 of level H. This causes the start transistors Qst to be turned on, so that the organic EL elements OLED and each drive transistor Qd are in an electrically connected state through the respective wirings F. As a result, current flowing in the drive transistors Qd is supplied as the drive current Iel to the respective organic EL elements OLED, so that the organic EL elements OLED emit light in accordance with the level of current flowing in the drive transistors Qd.

Next, based on the scanning drive signal SK, the scanning line drive circuit 13 selects the next scanning line Y2. In the same way, the scanning line drive circuit 13 successively supplies the scanning signal SC2 and the timing signal SY2 to the pixels 20 on the selected scanning line Y2. Then, the organic EL elements OLED of the pixels 20 connected to the scanning line Y2 emit light in accordance with the level of current flowing in each of the corresponding drive transistors Qd. After this, in the same way, based on the scanning drive signal SK, the scanning line drive circuit 13 successively selects the scanning lines, and supplies the scanning signals SC3 to SCn and the timing signals SY3 to SYn to the pixels 20 connected to the respective selected scanning lines. As a result, the organic EL elements OLED successively emit light in accordance with the respective levels of current flowing in the respective drive transistors Qd. When the last scanning line Yn is selected, and the organic EL elements emit light based on the data signal Idata, an image of one frame is displayed on the display panel 12.

Subsequently, after one frame period is completed, the scanning line drive circuit 13 selects the scanning line Y1 based on the scanning drive signal SK, and supplies the timing signal SY1 of level L to each of the pixels 20 through the signal line LS1. This causes all the start transistors Qst of the respective pixels 20 on the scanning line Y1 to be turned off, so that the organic EL elements OLED of the respective pixels 20 on the scanning line Y1 stop emitting light. As a result, the light-emission period of the organic EL elements OLED of the respective pixels 20 on the scanning line Y1 ends.

At the same time that the scanning line drive circuit 13 supplies the timing signal SY1 of level L, it supplies the scanning signal SC1 of level H to the pixels 20 through the scanning line Y1. This causes the first and second switching transistors, Qsw1 and Qsw2, of each pixel 20 on the scanning line Y1 to be turned on, so that data is written again.

In this way, after one frame period ends, the scanning line drive circuit 13 successively selects the scanning lines, Y1 to Yn, based on the scanning drive signal SK, so that the same operations as those described above are carried out in order to display an image.

As described above, the scanning line drive circuit 13 successively selects the scanning lines, Y1 to Yn, based on the scanning drive signal SK, and successively outputs the scanning signals and the timing signals to the pixels 20 connected to the respective selected scanning lines. In addition, the data signals Idata are supplied to the pixels 20 connected to the respective selected scanning lines in order to write data. By this, a predetermined image can be displayed on the display panel 12.

The pixel and the organic EL display in the exemplary embodiment can provide the following features.

(1) In the exemplary embodiment, each circuit formation area ZC is an annular formation area that does not include a substantially central portion of the corresponding pixel 20 disposed in the display panel 12. Each light-emission area ZL is provided in the substantially central portion. One drive circuit KC is formed in each circuit formation area ZC, and four organic EL elements OLED are formed in each light-emission area ZL. Each drive circuit KC and the corresponding organic EL elements OLED are connected parallel to each other by the wirings F. Therefore, even if variations occur in the input impedances of the organic EL elements OLED due to manufacturing variations thereof, an amount of drive current that corresponds to that flowing in the organic EL element OLED having a high input impedance flows in the organic EL elements OLED having low input impedances. As a result, since the amount of drive current Iel of the four organic EL elements OLED as a whole is averaged, it is possible to reduce variations in light emission of the pixels 20 caused by variations in the input impedances. Therefore, even if manufacturing variations occur in the organic EL elements OLED, it is possible to provide an organic EL display 10 which-makes it possible to precisely control the light emission of the pixels 20.

(2) In the exemplary embodiment, if a manufacturing defect occurs in, for example, one of the four organic EL elements OLED, the wiring F connecting this organic EL element OLED and the drive circuit KC is disconnected. As a result, even if, for example, three of the four organic EL elements OLED do not emit light at all due to manufacturing defects in the three organic EL elements OLED, the remaining one organic EL element OLED can emit light. Therefore, compared to a display including a related art pixel in which one organic EL element OLED is formed with respect to one drive circuit KC, even if data signals Idata are supplied due to electrical contact failure of the organic EL elements OLED, it is possible to reduce the production of defective pixels that provide a dark display all the time. Consequently, even if the organic EL elements OLED do not emit light at all due to defects occurring in the organic EL elements OLED when they are being manufactured, the remaining one organic EL element OLED emits light, thereby making it possible to reduce variations in the light emission of the organic EL elements OLED.

(3) In the exemplary embodiment, if, for example, one light-emitting film LF of one pixel 20 is considerably thicker or thinner than that of the other light-emitting films LF, the wiring F connected to the pixel electrode 35 of the light-emitting film LF of the one pixel 20 is disconnected by, for example, laser. This prevents the drive current Iel from being supplied to the light-emitting film LF.

Therefore, it is possible to make uniform the thickness of the light-emitting films LF. As a result, it is possible for the input impedances of the organic EL elements OLED to be equal to each other.

Second Exemplary Embodiment

Next, a second exemplary embodiment of the present invention will be described with reference to FIG. 6. Structural parts in the second exemplary embodiment that correspond to those in the first exemplary embodiment are given the same reference numerals, and will not be described in detail below.

Figure 6:
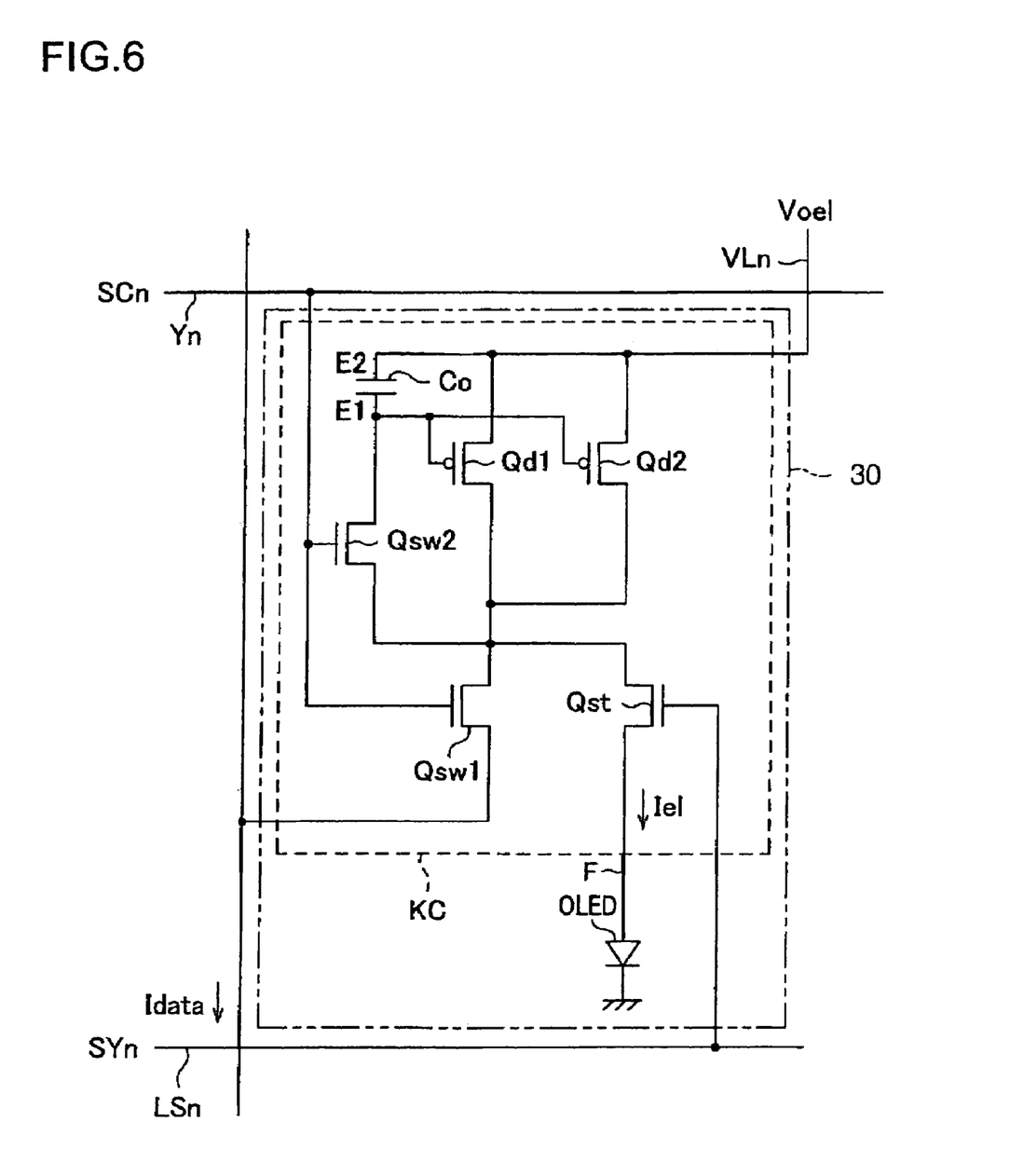
FIG. 6 is a circuit schematic of a pixel in a second exemplary embodiment.

FIG. 6 shows a circuit schematic of a pixel 30 disposed in the display panel 12 of the organic EL display 10.

The locations where a circuit formation area ZC and a light emission area ZL of the pixel 30 in the exemplary embodiment are formed are not limited to the locations of the circuit formation area ZC and the light emission area ZL of each pixel 20 in the first exemplary embodiment, so that they may be disposed at any location.

The structure of the circuit of each pixel 36 in the exemplary embodiment is the same as in the first exemplary embodiment. Therefore, for convenience of explanation, the pixel 30 disposed at a location corresponding to an intersection of an nth scanning line Yn and an mth data line Xm will only be described.

A drive circuit KC in the exemplary embodiment includes first and second drive transistors, Qd1 and Qd2, first and second switching transistors, Qsw1 and Qsw2, a start transistor Qst, and a hold capacitor Co. The first and second drive transistors, Qd1 and Qd2, are transistors that function as current sources to supply electric current. The first and second switching transistors, Qsw1 and Qsw2, and the start transistor Qst are transistors that function as switching elements.

The second drive transistor Qd2 is formed so that its gain coefficient is equal to the gain coefficient of the first drive transistor Qd1. Therefore, the level of-current that flows between the source and drain of the second drive transistor Qd2 is equal-to the level of current that flows between the source and drain of the first drive transistor Qd1.

In the exemplary embodiment, the first and second drive transistors Qd1 and Qd2 each have p-type conductivity, and the first and second switching transistors, Qsw1 and Qsw2, and the start transistor Qst, each have n-type conductivity; Ordinarily, the first and second drive transistors, Qd1 and Qd2, the first and second switching transistors, Qsw1 and Qsw2, and the start transistor Qst, are each a TFT (thin film transistor).

The drain of the first drive transistor Qd1 is connected to the drain of the first switching transistor Qsw1. The source of the first switching transistor Qsw1 is connected to the data line Xm.

The second switching transistor Qsw2 is connected between the drain and the gate of the first drive transistor Qd1. The gate of the second switching transistor Qsw2 is connected to the gate of the first switching transistor Qsw1 and to the scanning line Yn. Therefore, an on-off control operation is performed on the first switching transistor Qsw1 and the second switching transistor Qsw2 at the same time in accordance with the scanning signal SCn output from the scanning line drive circuit 13 through the scanning line Yn.

The source of the first drive transistor Qd1 is connected to the power line VLm, so that a drive voltage Voel is supplied thereto. A first connection terminal E1 of the hold capacitor Co is connected to the gate of the first drive transistor Qd1, and the source of the first drive transistor Qd1 is connected to a second connection terminal E2 of the hold capacitor Co. The hold capacitor Co accumulates charge in accordance with the current level of the data signal Idata.

The drain of the first drive transistor Qd1 is connected to the drain of the start transistor Qst. Through a wiring F, the source of the start transistor Qst is connected to an organic EL element OLED. The gate of the start transistor Qst is connected to a signal line LSn. Therefore, an on-off control operation is performed on the start transistor Qst in accordance with a timing signal SYn supplied from the scanning line drive circuit 13 through the signal line LSn.

The second drive transistor Qd2 is connected parallel to the first drive transistor Qd1 having the above-described structure.

More specifically, the source of the second drive transistor Qd2 is connected to the source of the first drive transistor Qd1. The gate of the second drive transistor Qd2 is connected to the gate of the first drive transistor Qd1. The drain of the second drive transistor Qd2 is connected to the drain of the first drive transistor Qd1. In other words, the first connection terminal E1 of the hold capacitor Co is connected to the sources of the first and second drive transistors, Qd1 and Qd2, and the second connection terminal E2 of the hold capacitor Co is connected to the gates of the first and second drive transistors, Qd1 and Qd2.

A scanning signal SCn of level H is output to the drive circuit KC having the above-described structure from the scanning line drive circuit 13 through the. scanning line Yn. This causes the first and second switching transistors, Qsw1 and Qsw2, to be turned on. As a result, the data signal Idata is supplied to the pixel 30 through the data line Xm. A charge that corresponds to the data signal Idata is accumulated in the hold capacitor Co.

At this time, when the first and second drive transistors, Qd1 and Qd2, are both normally driven, as mentioned above, current of the same level flows between the source and drain of the first drive transistor Qd1 and between the source and drain of the second drive transistor Qd2. Therefore, current of a level corresponding to ½ that of the data signal Idata flows between the source and drain of the first drive transistor Qd1 and between the source and drain of the second drive transistor Qd2.

As a result, when the first and second drive transistors, Qd1 and Qd2, are both normally driven, a charge corresponding to ½ the current level of the data signal Idata is accumulated in the hold capacitor Co.

If only one of the first and second drive transistors, Qd1 and Qd2, is driven normally, the other of the first and second drive transistors, Qd1 and Qd2, is electrically disconnected by laser. This causes the data signal Idata to be supplied only between the source and drain of either the first drive transistor Qd1 or the second drive transistor Qd2 that is driven normally.

As a result, when only one of the first and second drive transistors, Qd1 and Qd2, is normally driven, the hold capacitor Co accumulates a charge corresponding to the current level of the data signal Idata.

With the charge being accumulated in the hold capacitor Co, the scanning line drive circuit 13 outputs the scanning signal SCn for turning off both the first and second switching transistors, Qsw1 and Qsw2, through the scanning line Yn.

This causes both the first and second switching transistors, Qsw1 and Qsw2, to be turned off.

As a result, when both the first and second drive transistors, Qd1 and Qd2, are normally driven, the drive current Iel corresponding to the charge accumulated in the hold capacitor Co flows between the source and the drain of each of the first and second drive transistors, Qd1 and Qd2. Here, the level of the drive current Iel flowing between the source and the drain of each of the first and second drive transistors, Qd1 and Qd2, is a value corresponding to ½ the current level of the data signal Idata.

When only one of the first and second drive transistors, Qd1 and Qd2, is normally driven, the drive current Iel corresponding to the charge accumulated in the hold capacitor Co flows between the source and drain of either one of the first and second drive transistors, Qd1 and Qd2, that is driven normally. Here, the level of the drive current Iel flowing between the source and drain of either one of the first and second drive transistors, Qd1 and Qd2, that is normally driven is a value corresponding to the current level of the data signal Idata.

In this state, when the scanning line drive circuit 13 supplies the timing signal SYn to turn on the start transistor Qst through the signal line LSn, the start transistor Qst is turned on.

As a result, when both of the first and second drive transistors, Qd1 and Qd2, are normally driven, an amount of drive current Iel equal to the total sum of the amounts of drive current Iel flowing between the sources and the drains of the respective first and second drive transistors, Qd1 and Qd2, is supplied to the start transistor Qst. In other words, the level of the drive current Iel supplied to the start transistor Qst is a value corresponding to the current level of the data signal Idata.

When only one of the first and second drive transistors, Qd1 and Qd2, is normally driven, the drive current Iel flowing between the source and the drain of either one of the first and second drive transistors, Qd1 and Qd2, that is normally driven is supplied to the start transistor Qst. In other words, the level of the drive current Iel supplied to the start transistor Qst is a value corresponding to the current level of the data signal Idata.

Then, the drive current Iel is supplied to the anode of each organic EL element OLED through the corresponding wiring F, so that each organic EL element OLED emits light in correspondence with the level of the drive current Iel.

In other words, in the drive circuit KC in the exemplary embodiment, even if one of the first and second drive transistors, Qd1 and Qd2, is not driven, the organic EL elements OLED can emit light in correspondence with the level of the drive current Iel.

Even in the organic EL display 10 including the pixel 30 having the above-described structure, as in the first exemplary embodiment, the scanning line drive circuit 13 successively selects the scanning lines, Y1 to Yn, based on the scanning drive signal SK, and successively outputs the scanning signals and the timing signals to the pixels 30 connected to the respective selected scanning lines. The data signals Idata are supplied to the pixels 30 connected to the respective selected scanning lines in order to write data. In this way, a predetermined image can be displayed on the display panel 12.

The pixel and the organic EL display in the exemplary embodiment can provide the following features.

(1) In the exemplary embodiment, the second drive transistor Qd2 having a gain coefficient that is equal to the gain coefficient of the first drive transistor Qd1 is connected parallel to the first drive transistor Qd1 of each pixel 30. When only one of the first and second drive transistors, Qd1 and Qd2, of each pixel 30 is normally driven, the first drive transistor Qd1 or second drive transistor Qd2 that is not normally driven is electrically disconnected from the corresponding drive circuit KC by laser. As a result, even if one of the first and second drive transistors, Qd1 and Qd2, of each pixel 30 is not driven, the organic EL elements OLED can emit light in correspondence with the level of the drive current Iel.

Third Exemplary Embodiment

Next, application of the organic EL display 10 serving as an electro-optical device described in the first and second exemplary embodiments to an electronic apparatus will be described with reference to FIG. 7. The organic EL display 10 may be applied to various types of electronic apparatuses, such as a mobile personal computer, a cellular phone, and a digital camera.

Figure 7:
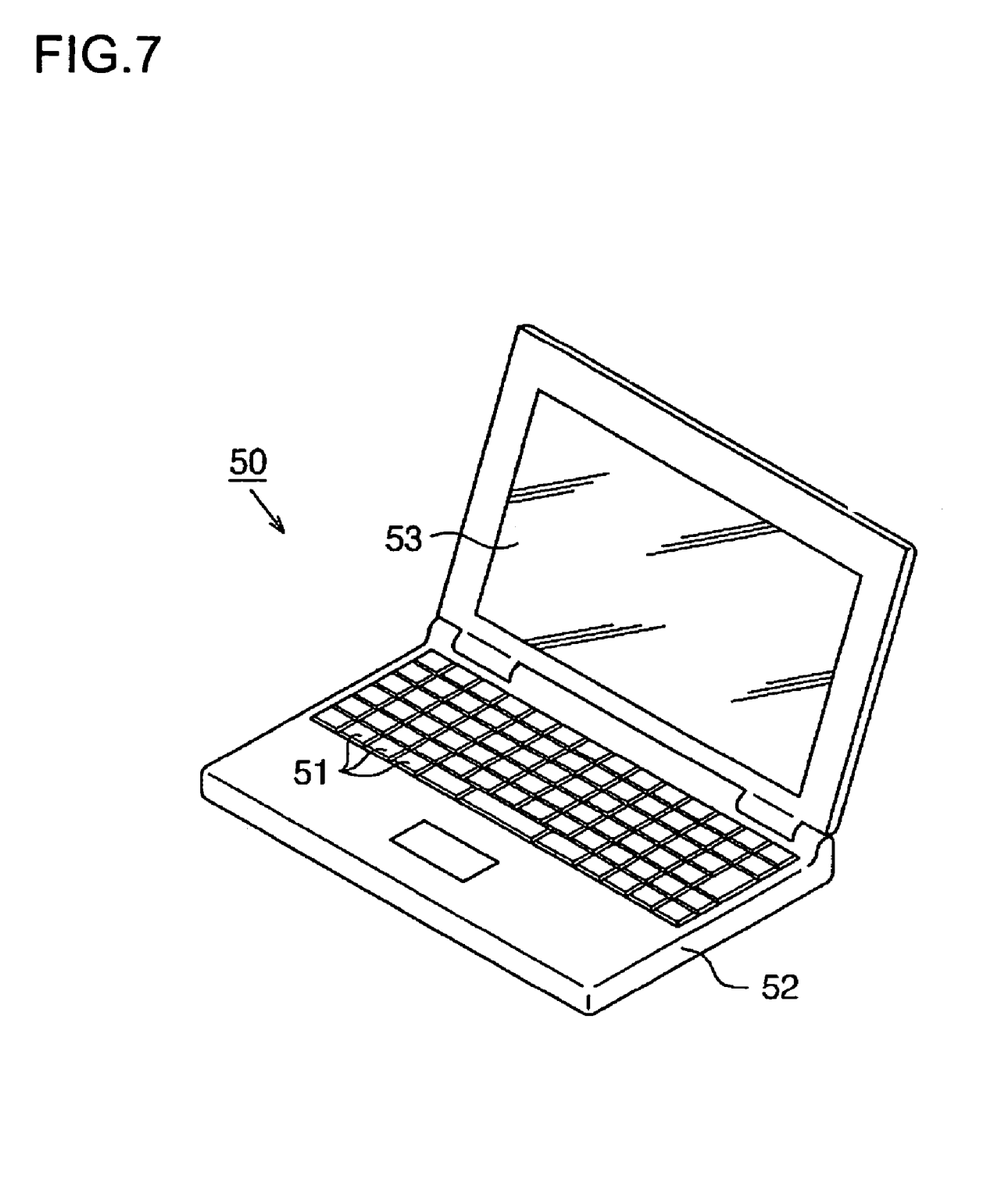
FIG. 7 is a perspective view of the structure of a mobile personal computer for illustrating a third exemplary embodiment.

FIG. 7 is a perspective view of the structure of a mobile personal computer. In FIG. 7, a personal computer 50 includes a body 52 including a keyboard 51, and a display unit 53 using the organic EL display 10.

Even in this case, the display unit 53 using the organic EL display 10 provides the same advantages as those of the first exemplary embodiment or the second exemplary embodiment. As a result, it is possible to provide the mobile personal computer 50 including the organic EL display 10 which makes it possible to perform a precise controlling operation even if a manufacturing variation occurs.

The present invention is not limited to the above-described exemplary embodiments, so that the following exemplary embodiments are possible.

In the first exemplary embodiment, a plurality of organic EL elements (four organic EL elements OLED) serving as electronic elements or electro-optical elements are formed, while, in the second exemplary embodiment, a plurality of drive transistors (two drive transistors, Qd1 and Qd2) serving as transistors are formed. The present invention may be applicable to an electronic circuit, an electronic device, or an electro-optical device including both a plurality of organic EL elements OLED and a plurality of drive transistors. In this case, the advantages of both the first and second exemplary embodiments are provided.

In the first exemplary embodiment, the circuit formation area ZC of each pixel 20 is an annular formation area that does not include a substantially central portion. The light-emission area ZL of each pixel 20 is provided in the substantially central portion. Each drive circuit KC is formed in its corresponding circuit formation area ZC, and a plurality of organic EL elements OLED are formed in each light-emission area ZL.

Figure 8:
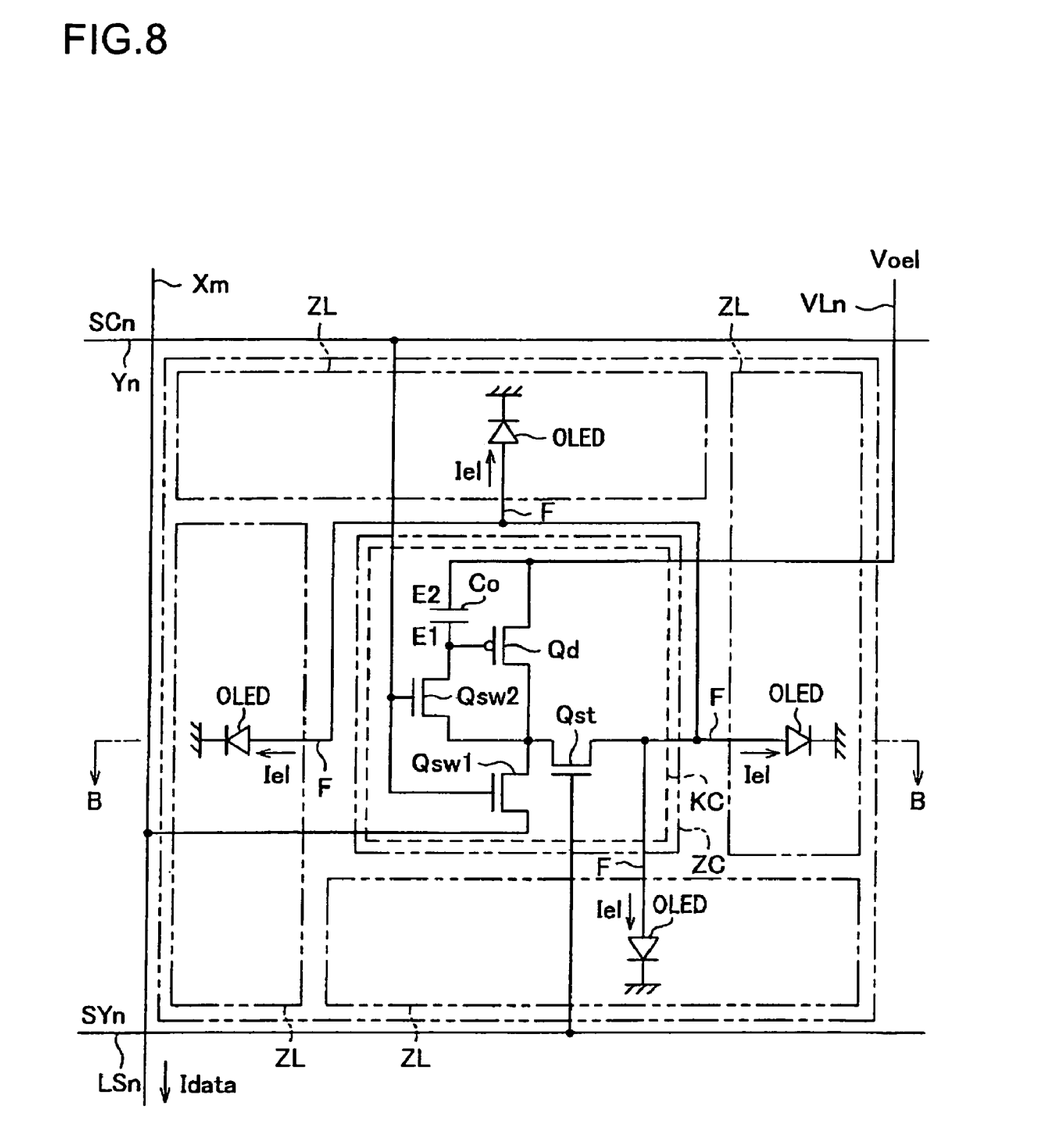
FIG. 8 is a circuit schematic of a pixel in another exemplary embodiment.
Figure 9:
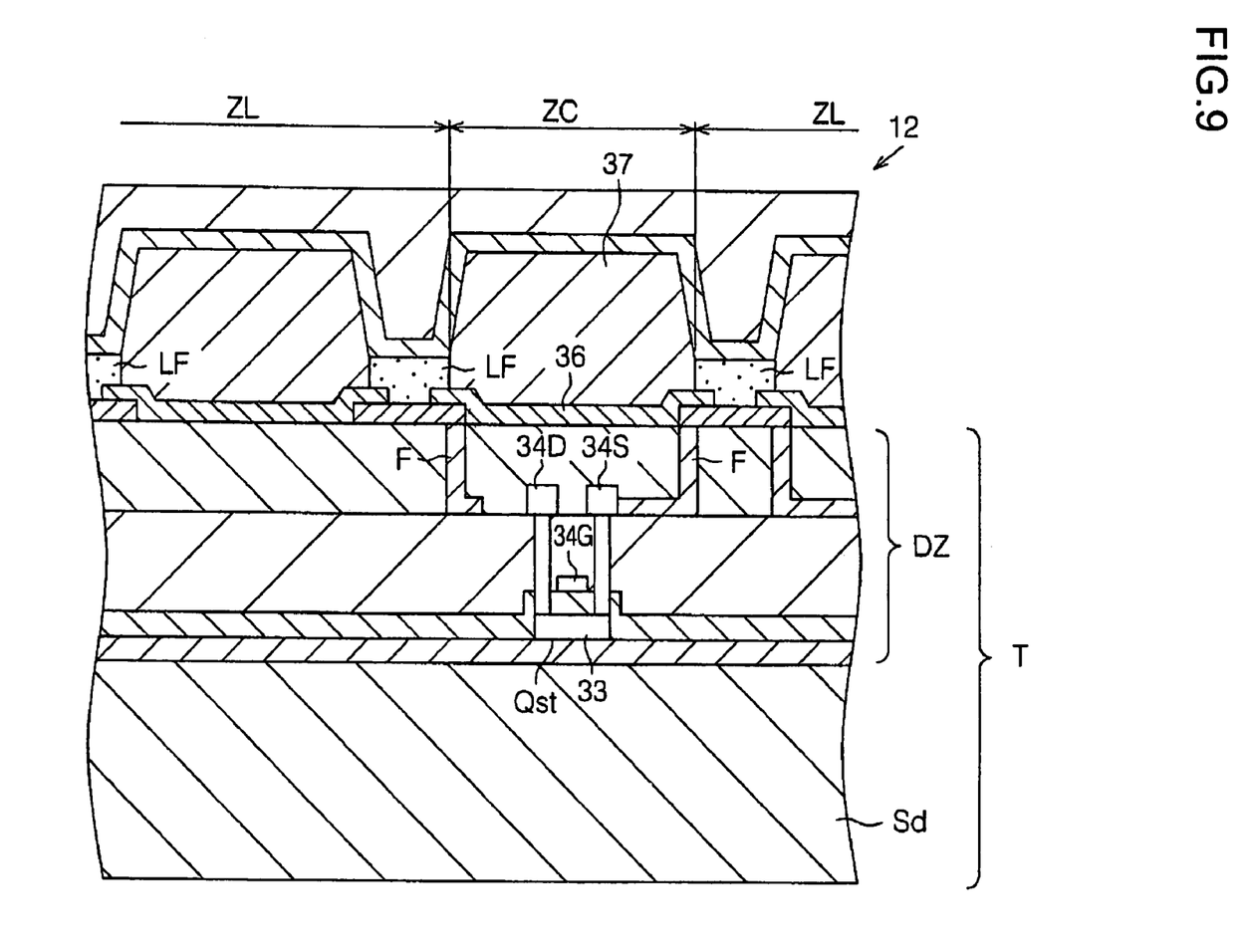
FIG. 9 is a partial sectional view of a display panel in another exemplary embodiment.

As shown in FIG. 8, a substantially central portion of a pixel 20 may be a circuit formation area ZC, and annular formation areas surrounding the substantially central portion may be light emission areas ZL. A drive circuit KC is formed in the circuit formation area ZC. Organic EL elements OLED may be formed in the light emission areas ZL in the vertical and horizontal directions. FIG. 9 is a partial sectional view of the structure of the display panel 12 including such a pixel 20. The partial sectional view of FIG. 9 is a sectional view taken along plane B-B of FIG. 8 in which a start transistor Qst and two organic EL elements OLED that are connected to the start transistor Qst through wirings F are formed. As shown in FIG. 9, the drive circuit KC is formed in an element formation layer DZ of the circuit formation area ZC. The light emission areas ZL are formed around the circuit formation area ZC. By forming the light emission areas ZL including light emitting films LF, it is possible to make the fact that the circuit formation area ZC does not emit light less noticeable.

In the first exemplary embodiment, the data signals Idata correspond to electrical currents, and the drive transistors Qd control the drive current Iel whose level is in correspondence with the data signals Idata. It is also possible that using data signals including voltage signals, the drive current Iel whose level is in correspondence with the data signals is controlled by the drive transistors Qd. This makes it possible to provide the same advantages as those of the exemplary embodiment.

Although, in the first exemplary embodiment, four organic EL elements OLED are formed in each light emission area ZL, the present invention is-not limited thereto, and any number of them may be used as long as there are at least two of them.

Although, in the first and second exemplary embodiments of the present invention, the organic EL display 10 is what is called a back emission type to display an image from the back surface side of the element substrate T, the present invention is not limited thereto, and the organic EL display 10 may be of a top emission type. This makes it possible to increase a numerical aperture by an amount corresponding to the circuit formation area ZC of each pixel 20 or each pixel 30.

Although, in the second exemplary embodiment, the first and second drive transistors, Qd1 and Qd2, each include one transistor, the first drive transistor Qd1 or the second drive transistor Qd2 may include a plurality of unit transistors that are connected in series or parallel.

Although, in the first and second exemplary embodiments, the organic EL displays 10 include pixels 20 and pixels 30 including organic EL elements OLED of one color, respectively, the present invention may be applied to an organic EL display including pixels 20 or pixels 30 including organic EL elements OLED of three colors, red, green, and blue.

Although, in the first and second exemplary embodiments, desirable results are obtained by producing the pixels 20 and pixels 30, respectively, the present invention may be applied to an electronic circuit for driving current drive elements like light-emitting elements, such as LEDs or FEDs, other than the organic EL elements OLED. It may also be applied to a storage device such as RAM (in particular, MRAM).

Although, in the first and second exemplary embodiments, organic EL elements OLED are used as current drive elements, inorganic EL elements may be used. In other words, the present invention may be applied to an inorganic EL display comprising inorganic EL elements.

What is claimed is:

1. An electro-optical device, comprising:
   a plurality of pixel circuits in correspondence with intersections of a plurality of scanning lines and a plurality of data lines,
   each pixel circuit including electro-optical elements and active elements, each electro-optical element having a first terminal and a second terminal and being driven by a drive voltage applied to the first terminal or by a drive current flowing through the first terminal and the second terminal, each active element controlling the drive voltage or the drive current, and
   the plurality of pixel circuits including a pixel circuit in which at least two electro-optical elements are electrically connected in parallel with an active element.

2. The electro-optical device according to claim 1, each electro-optical element being an electroluminescence element.

3. The electro-optical device according to claim 2, each electroluminescence element being an organic electroluminescence element.

4. An electro-optical device as claimed in claim 1,
   each pixel circuit having a plurality of electro-optical material placement areas where electro-optical material is placed, and
   the plurality of pixel circuits including a pixel circuit having at least one electro-optical material placement area in which the electro-optical material does not operate, among the plurality of operational electro-optical material placement areas.

5. The electro-optical device according to claim 4, the electro-optical material being an organic material.

6. An electronic apparatus including the electro-optical device of claim 1.

7. An electro-optical device, comprising:

a plurality of unit pixels in correspondence with intersections of a plurality of scanning lines and a plurality of data lines, each unit pixel including a plurality of electro-optical elements and a plurality of control electronic elements to control a drive voltage or a drive current supplied to the electro-optical elements, and the plurality of unit pixels each including a control electronic element which is electrically disconnected from the electro-optical elements.

8. An electronic device, comprising:

a plurality of unit circuits in correspondence with intersections of a plurality of first signal lines and a plurality of second signal lines, each unit circuit including electronic elements and active elements, each electronic element having a first terminal and a second terminal and being driven by a drive voltage applied to the first terminal or by a drive current flowing through the first terminal and the second terminal, each active element controlling the drive voltage or the drive current, and the plurality of unit circuits including a unit circuit in which at least two active elements are electrically connected in parallel with an electronic element.

9. An electronic device, comprising:

a plurality of unit circuits in correspondence with intersections of a plurality of first signal lines and a plurality of second signal lines, each unit circuit including electronic elements and active elements, each electronic element having a first terminal and a second terminal and being driven by a drive voltage applied to the first terminal or by a drive current flowing through the first terminal and the second terminal, each active element controlling the drive voltage or the drive current, and the plurality of unit circuits including a unit circuit in which at least two electronic elements electrically connected in parallel are disposed in accordance with at least two active elements electrically connected in parallel.

10. An electro-optical device, comprising:

a plurality of pixel circuits in correspondence with intersections of a plurality of scanning lines and a plurality of data lines, each pixel circuit including electronic elements and active elements, each electro-optical element having a first terminal and a second terminal and being driven by a drive voltage applied to the first terminal or by a drive current flowing through the first terminal and the second terminal, each active element controlling the drive voltage or the drive current, and the plurality of pixel circuits including a pixel circuit in which at least two active elements are electrically connected in parallel with an electro-optical element.

11. An electro-optical device, comprising:

a plurality of pixel circuits in correspondence with intersections of a plurality of scanning lines and a plurality of data lines, each pixel circuit including electro-optical elements and active elements, each electro-optical element having a first terminal and a second terminal and being driven by a drive voltage applied to the first terminal or by a drive current flowing through the first terminal and the second terminal, each active element controlling the drive voltage or the drive current, and the plurality of pixel circuits including a pixel circuit in which at least two electro-optical elements electrically connected in parallel are disposed in accordance with at least two active elements electrically connected in parallel.

* * * * *